(12) United States Patent  (10) Patent No.: US 9,318,444 B2
Chen                      (45) Date of Patent:  *Apr. 19, 2016

(54) STRUCTURE DESIGNS AND METHODS FOR INTEGRATED CIRCUIT ALIGNMENT

(71) Applicant: Taiwan Semiconductor Manufacturing Company, Ltd., Hsin-Chu (TW)

(72) Inventor: Hsien-Wei Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,014

(22) Filed: Jun. 30, 2014

(65) Prior Publication Data
US 2014/0312454 A1  Oct. 23, 2014

Related U.S. Application Data

(63) Continuation of application No. 13/117,549, filed on May 27, 2011, now Pat. No. 8,779,556.

(51) Int. Cl.
H01L 23/544  (2006.01)
G03F 7/20    (2006.01)
G03F 9/00    (2006.01)
H01L 21/50   (2006.01)
H01L 27/02   (2006.01)

(52) U.S. Cl.
CPC .......... H01L 23/544 (2013.01); G03F 7/70625 (2013.01); G03F 7/70633 (2013.01); G03F 7/70683 (2013.01); G03F 9/7076 (2013.01); G03F 9/7084 (2013.01); H01L 21/50 (2013.01); H01L 27/0203 (2013.01); H01L 2924/0002 (2013.01)

(58) Field of Classification Search
CPC ........................... H01L 23/585; H01L 23/544
USPC ................................... 257/620, 757, E23.194
See application file for complete search history.

(56) References Cited

U.S. PATENT DOCUMENTS

| 6,278,957 | B1 | 8/2001 | Yasuda et al. |
| 6,593,168 | B1 | 7/2003 | Ehrichs et al. |
| 6,815,128 | B2 | 11/2004 | Rumsey et al. |
| 7,202,550 | B2 | 4/2007 | Fu et al. |
| 7,378,720 | B2 | 5/2008 | Fu et al. |
| 7,538,346 | B2 | 5/2009 | Chen et al. |
| 8,367,432 | B2 | 2/2013 | Shinkawata |
| 2010/0072578 | A1 | 3/2010 | Kunishima |

Primary Examiner — John C Ingham
(74) Attorney, Agent, or Firm — Haynes and Boone, LLP

(57) ABSTRACT

Devices and methods for pattern alignment are disclosed. The device includes an assembly isolation region, a seal ring region around the assembly isolation region, and a scribe line region around the seal ring region, and a plurality of die alignment marks disposed within the seal ring region that are alternately disposed adjacent the scribe line region and the assembly isolation region.

20 Claims, 15 Drawing Sheets

STRUCTURE DESIGNS AND METHODS FOR INTEGRATED CIRCUIT ALIGNMENT

CROSS-REFERENCE TO RELATED APPLICATIONS

This application is a continuation application of U.S. application Ser. No. 13/117,549, which was filed on May 27, 2011, the entire disclosure of which is incorporated herein by reference.

BACKGROUND

The semiconductor integrated circuit (IC) industry has experienced rapid growth. Technological advances in IC materials and design have produced generations of ICs where each generation has smaller feature sizes and more complex circuits than those from the previous generation. Semiconductor devices are fabricated by patterning a sequence of patterned and un-patterned layers, and the features on successive patterned layers are spatially related to each other. During the fabrication, each patterned layer must be aligned with the previous patterned layers with a degree of precision. Pattern alignment techniques typically provide alignment marks to achieve overall exposure field alignment. As technology nodes continue to decrease, it has been observed that such alignment techniques provide less than desirable alignment within the field.

SUMMARY

The present disclosure provides for many different embodiments. According to one embodiment, a semiconductor device is provided. The semiconductor device comprises a die including an integrated circuit region, an assembly isolation region around the integrated circuit region, and a seal ring region around the assembly isolation region. The device further includes a die alignment mark disposed within the seal ring region or the assembly isolation region.

Another broad embodiment provides for a semiconductor device including a plurality of exposure fields, and a plurality of dies within each exposure field, wherein each die comprises an integrated circuit region, an assembly isolation region around the integrated circuit region, and a seal ring region around the assembly isolation region. The device further includes scribe lines defining each exposure field and each die, an exposure field alignment mark for each exposure field, and a die alignment mark for each die, the die alignment mark disposed within the seal ring region or the assembly isolation region of each die.

Yet another broad embodiment provides for a method comprising providing a semiconductor device, defining a field on the semiconductor device, wherein a perimeter of the field is defined by a scribe line, and defining a die area within the field, wherein each die area includes an integrated circuit region, an assembly isolation region around the integrated circuit region, and a seal ring region around the assembly isolation region. The method further includes forming a die alignment mark within the seal ring region or the assembly isolation region.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
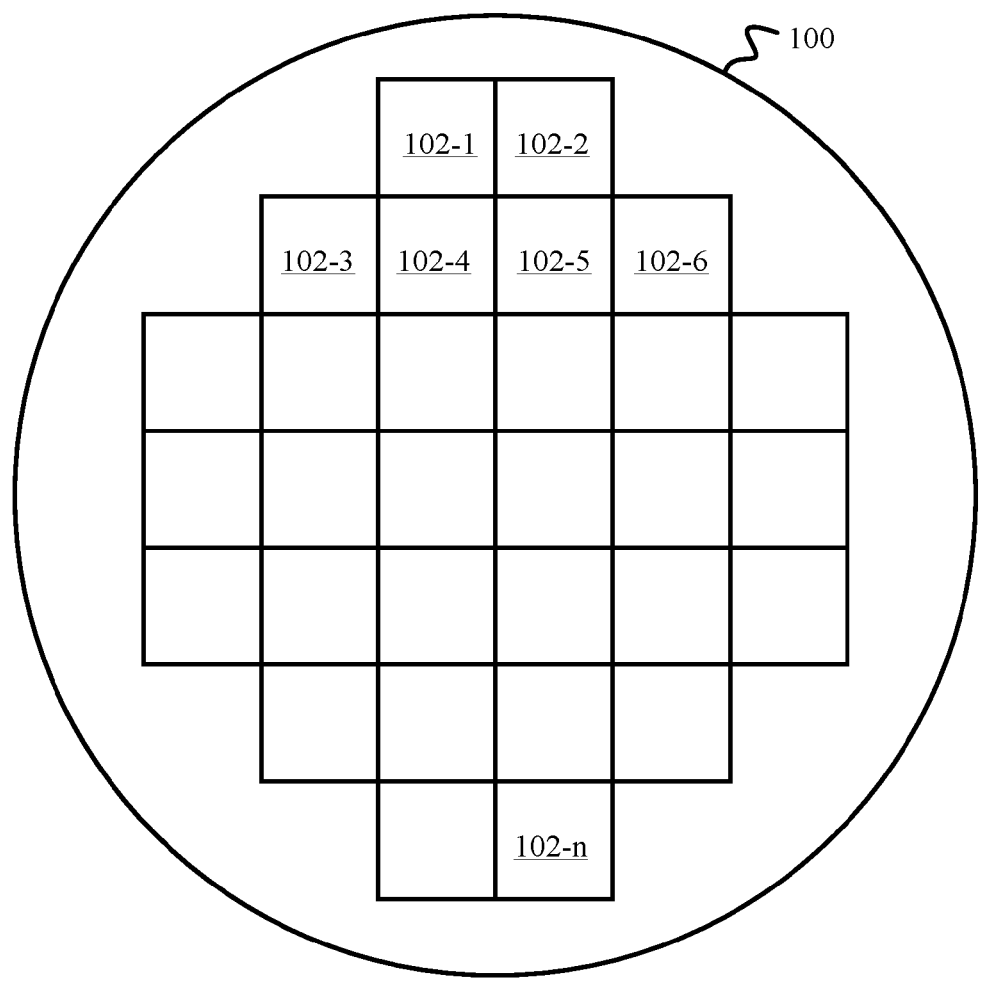
FIG. 1 illustrates a top view of a wafer according to various embodiments of the present disclosure.

The present disclosure relates generally to manufacturing semiconductor devices, and more particularly, to pattern alignment methods and design structures for manufacturing these semiconductor devices.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 illustrates a wafer 100. The wafer 100 includes a substrate (e.g., a semiconductor substrate), a mask (photomask or reticle, collectively referred to as mask), or any base material on which processing is conducted to produce layers of material, pattern features, and/or integrated circuits. For example, the wafer 100 comprises an elementary semiconductor including silicon and/or germanium in crystal; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In some examples, the silicon substrate may include a multilayer compound semiconductor structure. Alternatively, the wafer 100 may include a non-semiconductor material, such as a glass substrate for thin-film-transistor liquid crystal display (TFT-LCD) devices, or fused quartz or calcium fluoride for a photomask (mask).

The wafer 100 is subjected to one or more deposition, patterning, and/or etching processes to form a plurality of patterned and un-patterned layers thereon. For example, the wafer 100 is subjected to a lithography process to form one or more features on the wafer. In the present embodiment, the wafer 100 is subjected to a lithography process to form an integrated circuit device thereon. The terms lithography, immersion lithography, photolithography, and optical lithography may be used interchangeably. The lithography process projects an image of an integrated circuit device onto an exposure field of the wafer 100. Or, put another way, the lithography process transfers a pattern (i.e., image of an integrated circuit device) from a mask (also referred to as a photomask or reticle) onto the wafer. The process can involve projecting the image multiple times on the wafer, each projection patterning an exposure field of the wafer. As illustrated in FIG. 1, the wafer 100 is divided into one or more fields 102. The wafer is divided into exposure fields 102-1, 102-2, 102-3, 102-4, 102-5, 102-6, . . . , and 102-n. An exposure field includes an area of a substrate covered (e.g., exposed) by a single exposure process. So, when the wafer 100 is subjected to a lithography process, a single exposure process may be used to transfer a pattern to each field (i.e., 102-1, 102-2 . . . 102-n) to form integrated circuits within each field.

Figure 2:
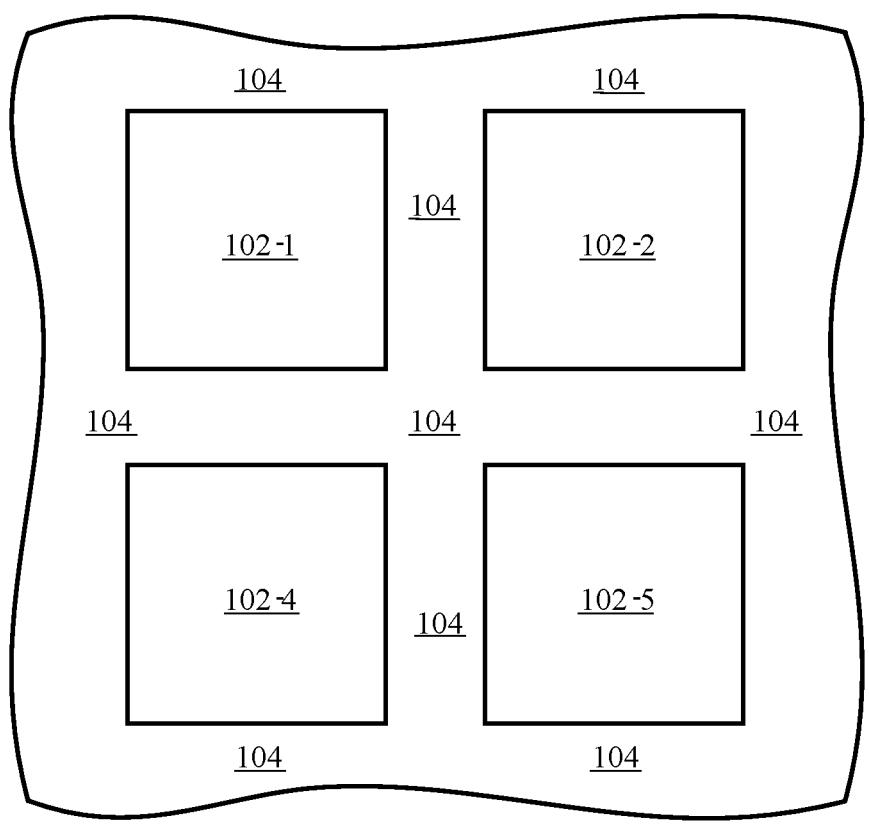
FIG. 2 illustrates an enlarged top view of a portion of the wafer of FIG. 1 according to various embodiments of the present disclosure.
Figure 3A:
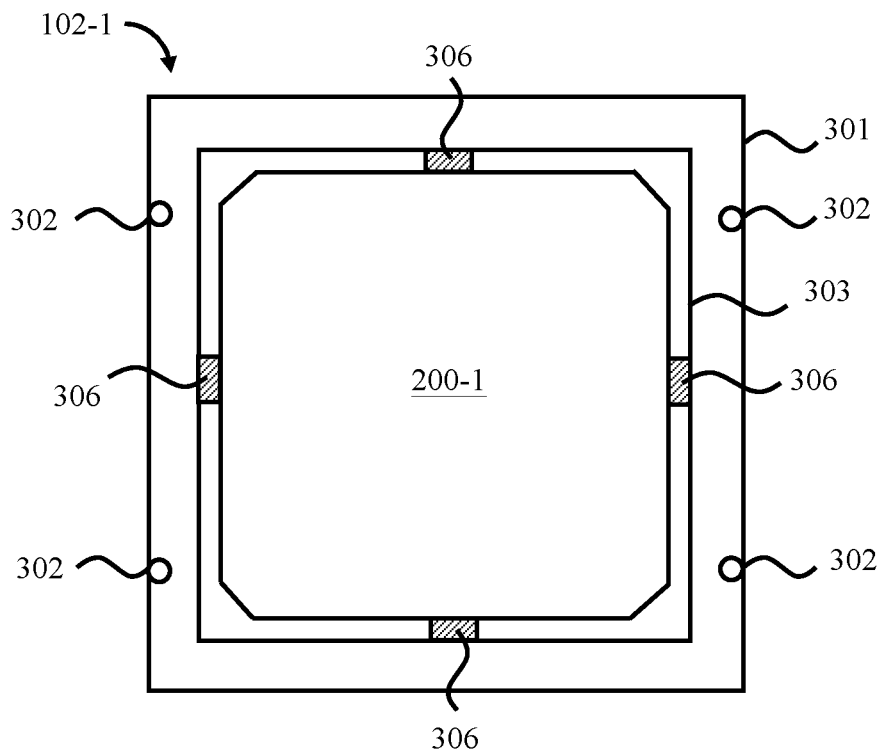
FIGS. 3A-3F illustrate top views of an exposure field according to various embodiments of the present disclosure.
Figure 3B:
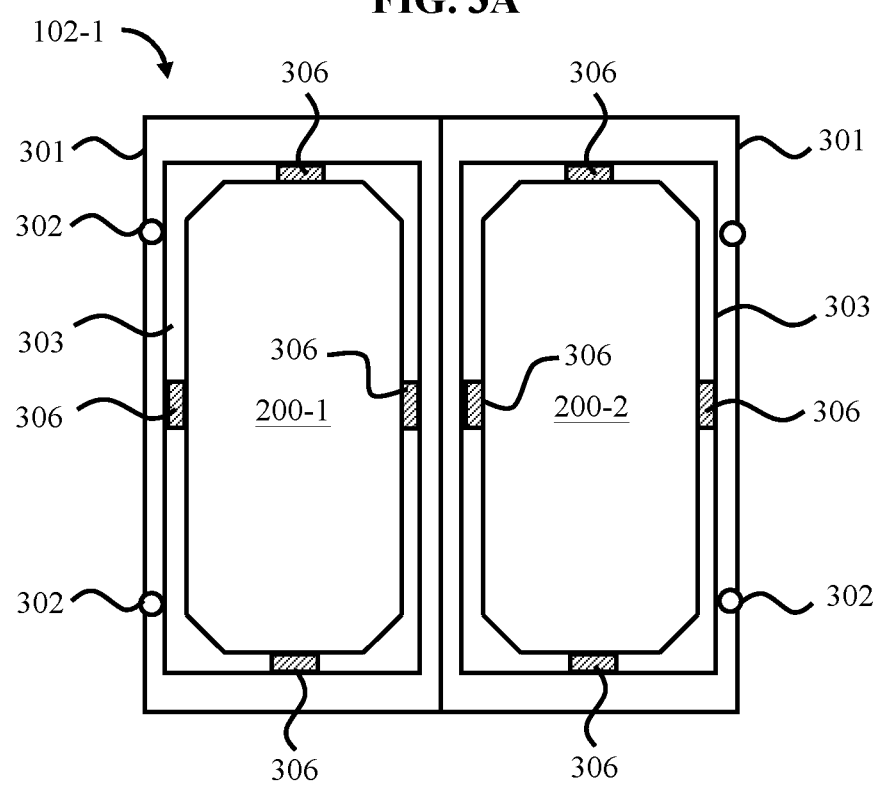
Figure 3C:
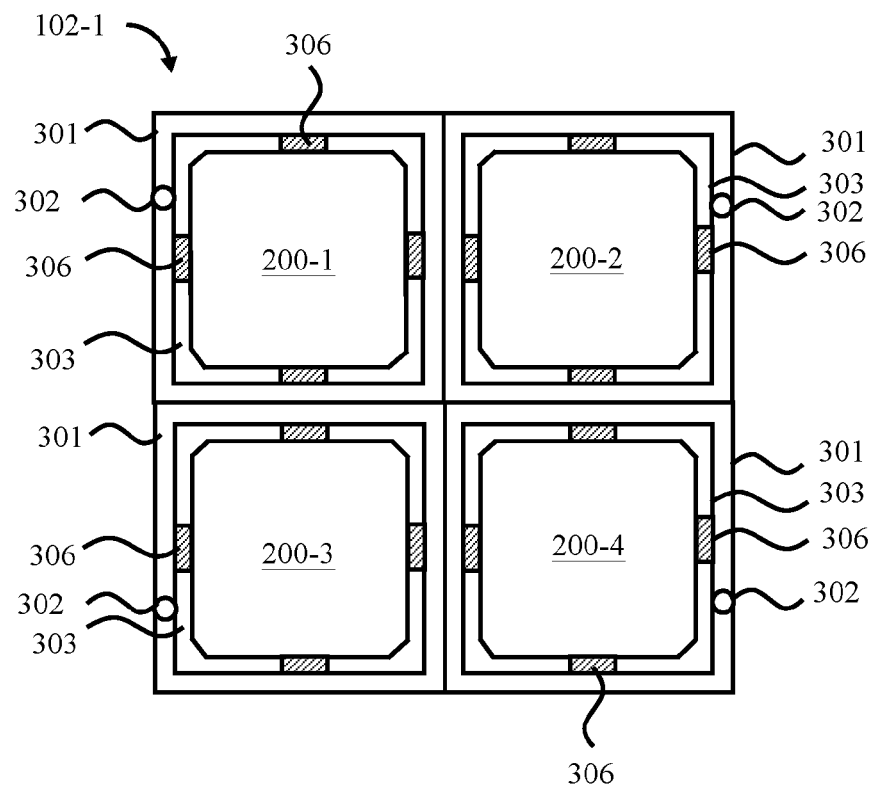
Figure 3D:
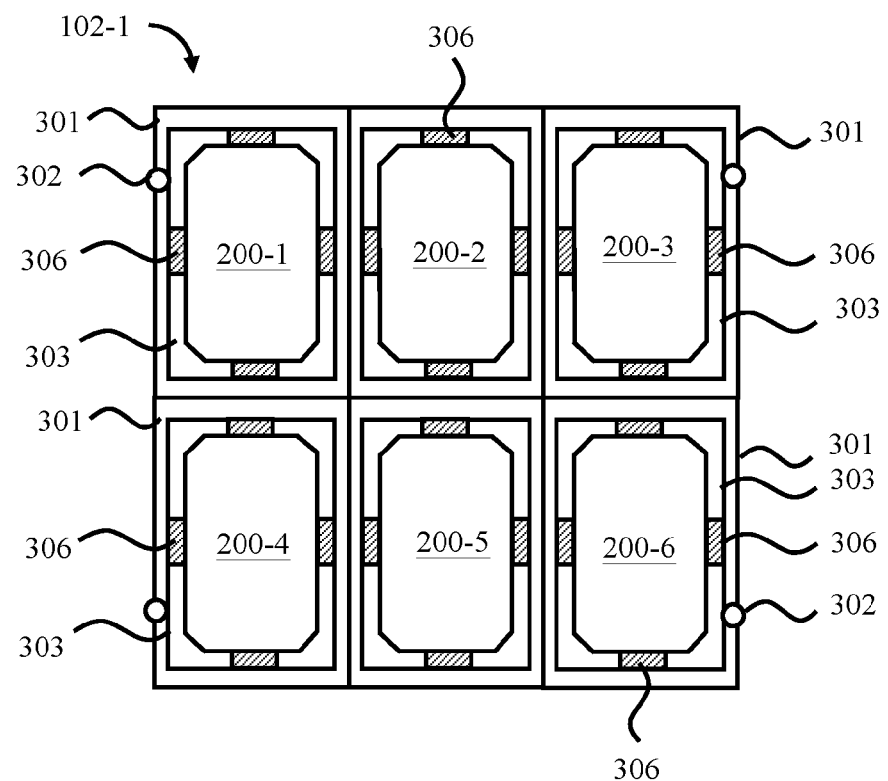
Figure 3E:
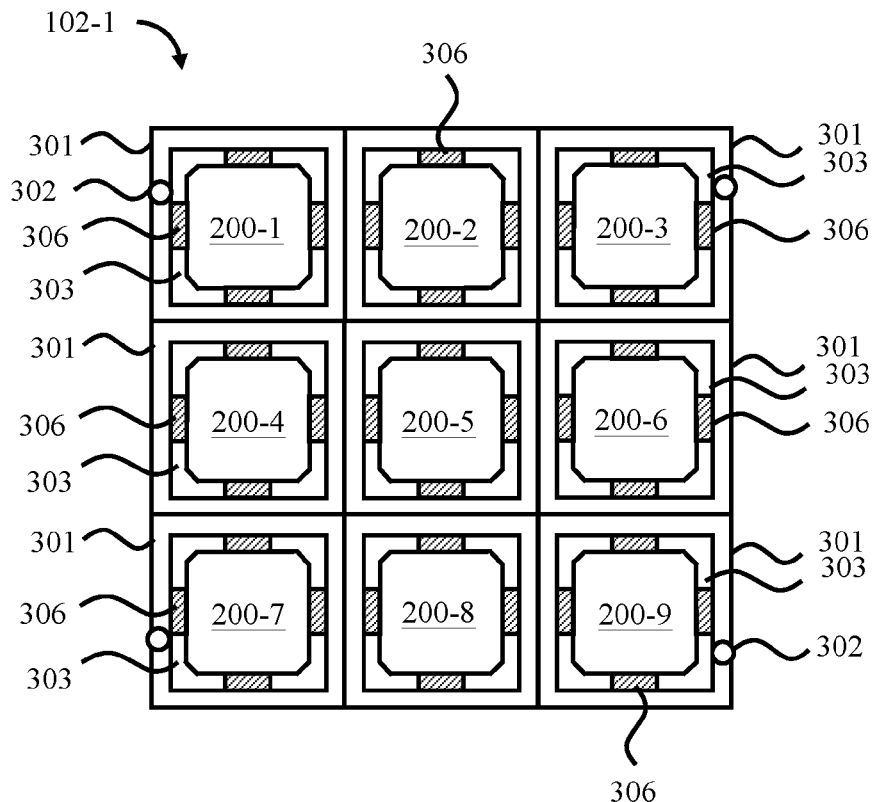
Figure 3F:
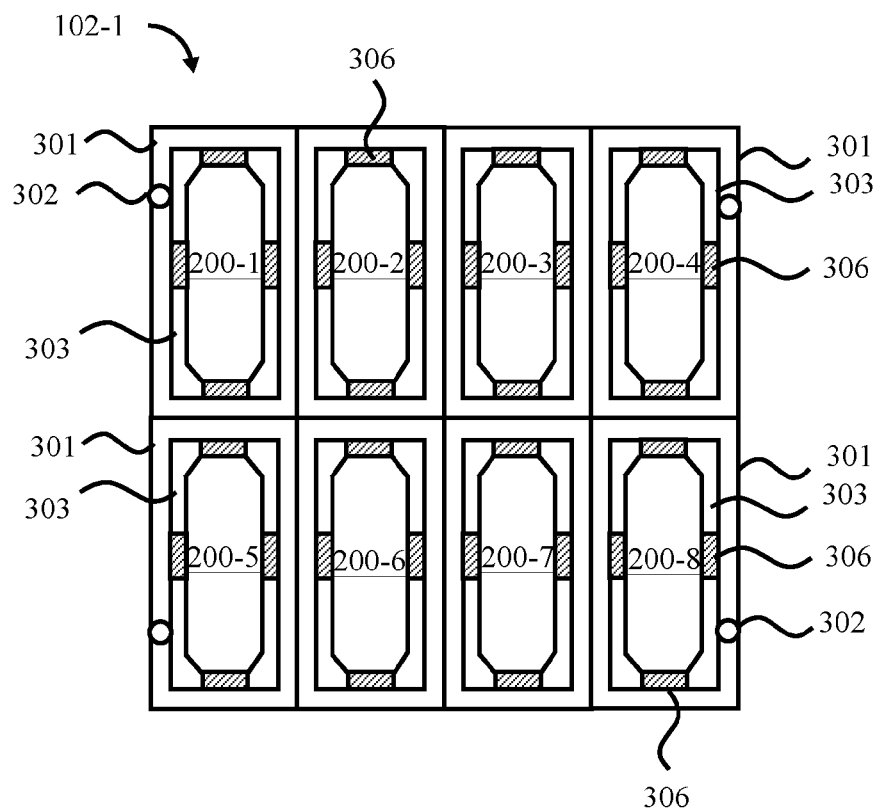

FIG. 2 illustrates a magnified portion of the wafer 100 containing fields 102-1, 102-2, 102-4, and 102-5. The fields 102 are separated or defined by scribe lines (or lanes) 104. In the present embodiment, the scribe lines 104 are configured between each field 102 to identify a perimeter of each field 102. When each field 102 is exposed, one or more dies (chips) are patterned within the field.

Referring now to FIGS. 3A-3F, one or more dies (chips) 200 of the wafer 100 are patterned within each exposure field 102, and thus, multiple dies 200 (i.e., dies 200-n) can be patterned within a single exposure field 102 (e.g., field 102-n). An exposure field can pattern a 1×1 chip array (FIG. 3A, a single chip 200-1 is patterned within exposure field 102-1); a 1×2 or 2×1 chip array (FIG. 3B, two chips 200-1, 200-2 are patterned within exposure field 102-1); a 2×2 chip array (FIG. 3C, four chips 200-1, 200-2, 200-3, 200-4 are patterned within exposure field 102-1); a 3×2 or 2×3 chip array (FIG. 3D, six chips 200-1, 200-2, 200-3, 200-4, 200-5, 200-6 are patterned within exposure field 102-1); a 3×3 chip array (FIG. 3E, nine chips 200-1, 200-2, 200-3, 200-4, 200-5, 200-6, 200-7, 200-8, 200-9 are patterned within exposure field 102-1); a 2×4 or 4×2 chip array (FIG. 3G, eight chips 200-1, 200-2, 200-3, 200-4, 200-5, 200-6, 200-7, 200-8 are patterned within exposure field 102-1); or other suitable chip arrays (chips 200-1 . . . 200-n are patterned within exposure field 102-1). Where multiple fields are delineated on the wafer 100, as in FIG. 1, the pattern is formed in each field 102. For example, if an exposure field patterns a 2×2 chip array, each exposure field (i.e., fields 102-1, 102-2, . . . and 102-n) will include four patterned chips (200-1, 200-2, 200-3, 200-4).

Similar to delineation of the fields 102, scribe line regions 301 separate (or define) adjacent dies 200. The scribe line regions/scribe lines 104 are dice/cut therethrough in a later fabrication process to provide individual dies, which may then be packaged and sold as individual integrated circuit chips. The scribe line regions are cut in such a way that the semiconductor devices in each die are not damaged. Within the scribe line regions 301 are seal ring regions 303, assembly isolation regions within the seal ring regions 303, and IC regions within the assembly isolation regions. In other words, an IC region of a die is surrounded by the assembly isolation region, the seal ring region 303 surrounds the assembly isolation region, and the scribe line region 301 surrounds the seal ring region.

As noted above, lithography processes form features on the wafer. In the present example, integrated circuit devices are formed on the wafer 100 to form a plurality of dies 200. The lithography process patterns a sequence of patterned and un-patterned layers, and the features on successive patterned layers are spatially related to each another. During fabrication, each patterned layer must be aligned with the previous patterned layers with a degree of precision. Thus, a key part of successful lithography relies on pattern recognition. Pattern recognition utilizes pattern alignment techniques. A lower (previous) patterned layer will include an overlay target, and a second pattern on an upper (next) patterned layer can then be aligned.

Pattern alignment techniques may form an exposure field alignment (or registration) mark 302 in the scribe lines surrounding each field 102. More particularly, four exposure field alignment marks 302 are placed in the scribe lines (e.g., scribe lines 301, 104) surrounding each field 102 as illustrated in FIGS. 3A-3F. The four exposure field alignment marks 302 may utilize a box-in-box ("BIB") pattern recognition technique for aligning successive patterned layers in one example.

Figure 4:
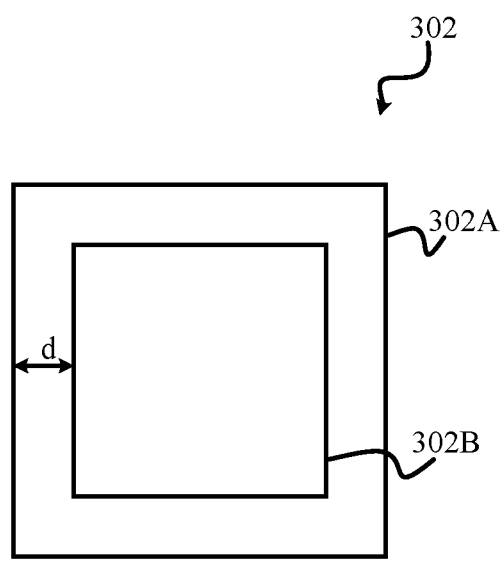
FIG. 4 illustrates a box-in-box alignment pattern according to various embodiments of the present disclosure.

Referring to FIG. 4, a box-in-box pattern recognition technique, in one example, utilizes an overly target 302A, shown as an outer box, and an inner box 302B. The BIB pattern recognition technique aligns the inner box 302B with the overlay target 302A. For the sake of example, the outer box 302A can be formed in a lower (previous) patterned layer and the inner box 302B will be formed in an upper (next) patterned layer. There may be one or more layers between the two boxes 302A and 302B. The outer box 302A has a first range of dimensions, and the inner box 302B has a second range of dimensions. For example, a width of the outer box 302A may be in the range of between about 10 μm and about 40 μm, while a width of the inner box 302B may be between about 5 μm and about 30 μm. As a result, a distance d between the boxes 302A and 302B may be between about 5 μm and about 20 μm. It is noted that other sizes of the boxes 302A and 302B are also contemplated. The alignment mark 302 may be designed to include shapes other than boxes, including triangles, rectangles, circles, T-shapes, L-shapes, pluses, crosses, octagons, other suitable shapes, and/or combinations. It is understood that the pattern recognition may utilize other overlay target designs, such as frame-in-frame, segmented-frame, advanced imaging metrology (AIM), and short vernier (SVNR).

Though the four corner BIB alignment marks 302 placed in the scribe lines surrounding each field 102 provide sufficient overall field alignment, as technology nodes continue to decrease, it has been observed that ensuring overall field alignment does not necessarily ensure satisfactory alignment of in-chip features, particularly as an exposure field 102 patterns multiple chips (e.g., 200-1 . . . 200-n). The present embodiments thus introduce alignment (registration marks) within a die/chip area of the field. More particularly, at least one die alignment mark is formed within a seal ring region and/or an assembly isolation region of at least one die of the exposure field. The die alignment marks formed within the fields 102 provide "eyes" inside the die/chip area 200, which provides improved overlay control.

Referring again to FIGS. 3A-3F, in addition to exposure field alignment marks 302, which are placed in the scribe lines 301 surrounding each field 102, die alignment marks 306 are formed within the seal ring region 303 of each die 200 (e.g., in FIG. 3A, alignment marks 306 are formed within non-corner areas or regions or portions of the seal ring region 303 of die 200-1; in FIG. 3B, alignment marks 306 are formed within non-corner areas/regions/portions of seal ring regions 303 of dies 200-1, 200-2; in FIG. 3C, alignment marks 306 are formed within non-corner areas/regions/portions of seal ring regions 303 of dies 200-1, 200-2, 200-3, 200-4; etc.).

As evident from FIGS. 3A-3F, as the number of dies 200 patterned within each field 102 increases, the die alignment marks within the field increases, and accordingly, the information known within the field 102 is increased. For example, referring to FIG. 3C, within a 2×2 chip array, alignment information is obtained at the center of the field 102 by the eight die alignment marks 306 closest to the center of the field 102. This provides "eyes" within the field 102 and within each die 200 patterned in the field 102, which can provide improved overlay control. So, not only may overall field alignment be achieved, but also alignment of individual features within a field may be achieved. It is understood that die alignment marks 306 may not necessarily be formed in the seal ring regions of every die 200 within an exposure field 102. It is further understood that a variety of variations are contemplated. FIGS. 3A-3F are merely exemplary, and any combination of dies 200 within a field 102 or combination of die alignment marks 306 is contemplated. For example, die alignment marks 306 may also be disposed within the assembly isolation region within and adjacent to the seal ring region of a die.

Figure 5A:
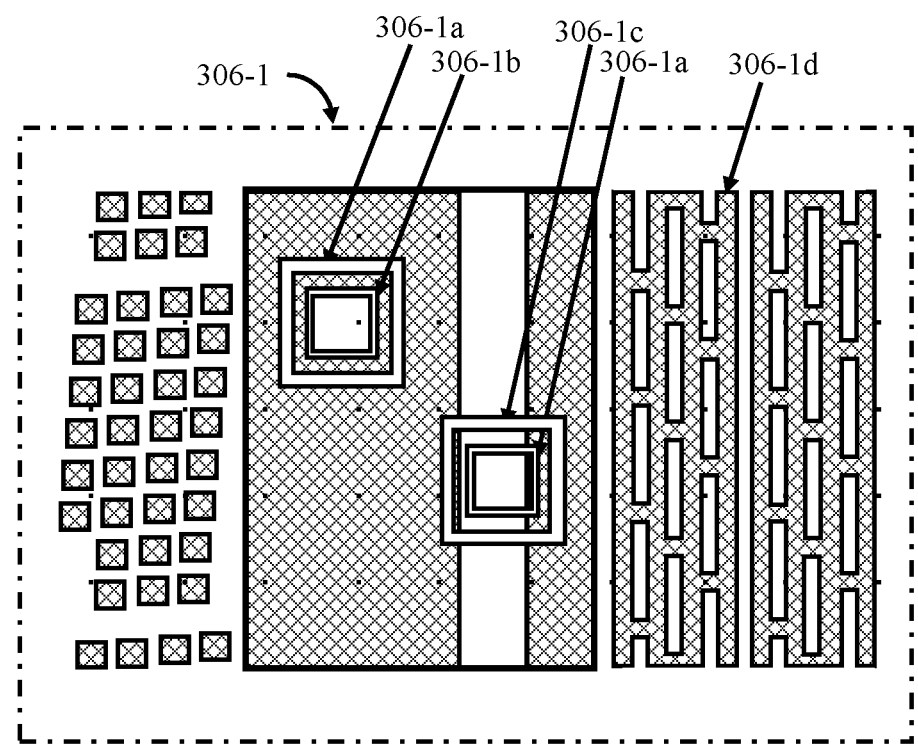
FIGS. 5A and 5B illustrate a critical dimension uniformity pattern of a die alignment mark according to various embodiments of the present disclosure.
Figure 5B:
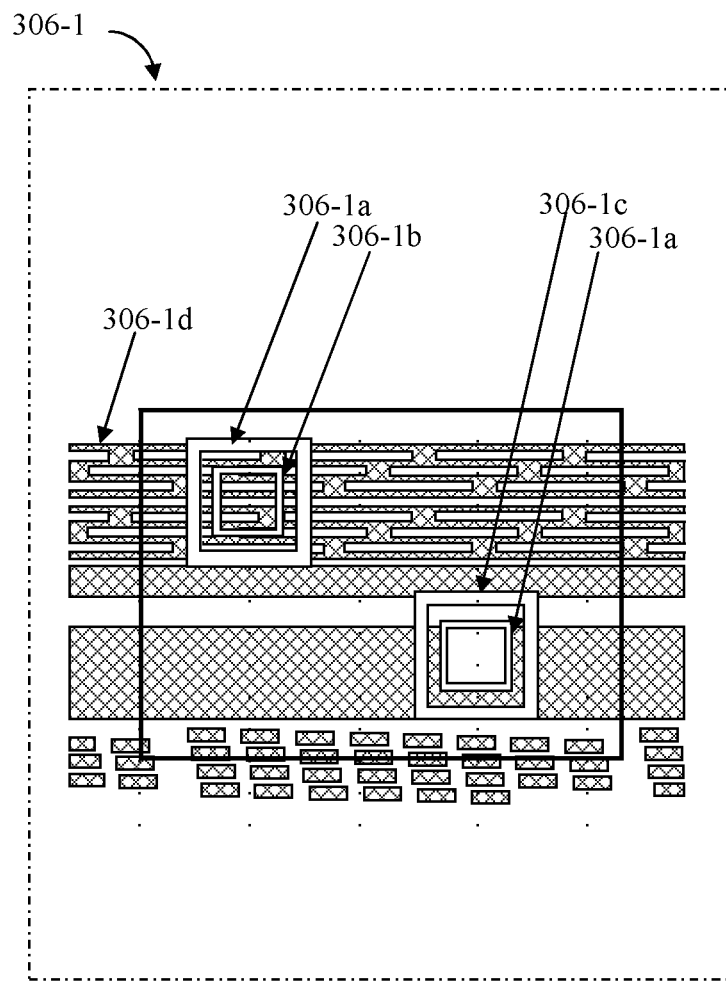

Referring now to FIGS. 5A and 5B, example views of a critical dimension uniformity (CDU) pattern of die alignment marks 306-1 are respectively illustrated according to various embodiments of the present disclosure. Die alignment marks 306-1 include a critical dimension uniformity pattern having an active (OD) layer 306-1c, a polysilicon (POLY) layer 306-1a, a contact (CO) layer 306-1b, and a metal (Mx) layer 306-1d.

Figure 6A:
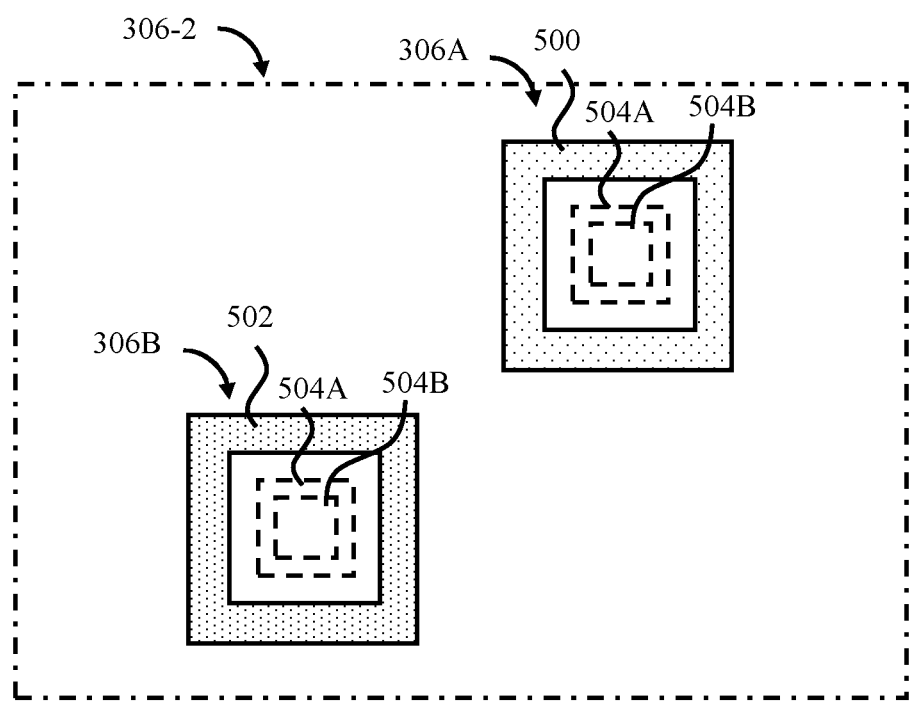
FIGS. 6A and 6B illustrate top views of a die alignment mark according to various embodiments of the present disclosure.
Figure 6B:
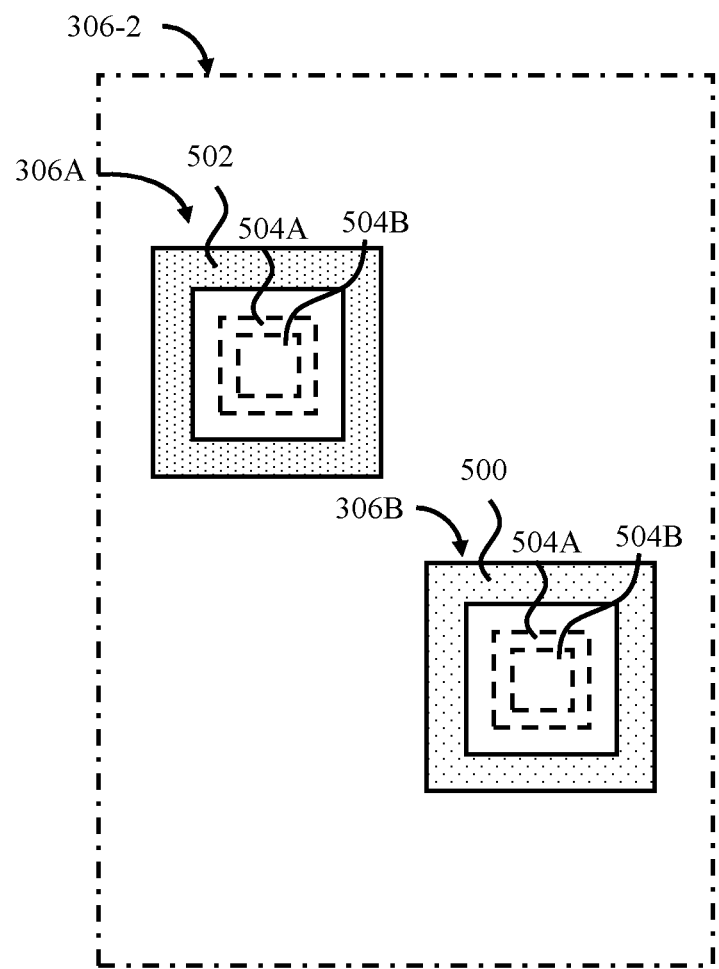

FIGS. 6A and 6B illustrate top views of a BIB pattern of die alignment marks 306-2 according to various other embodiments of the present disclosure. Similar to alignment mark 302 illustrated in FIG. 4, die alignment marks 306-2 utilize a box-in-box pattern recognition technique in this embodiment, which aligns a first overlay mark (outer box) formed in a lower patterned layer and a second overlay mark (inner box) formed in an upper patterned layer. Utilizing the BIB pattern recognition technique, overlay patterns/marks (outer and inner boxes) are formed in the various layers to provide various combinations of aligned layers. The alignment marks 306-2 are formed to provide alignment of the various layers of the integrated circuit region 210 (FIGS. 7A-7B and 8A-8C). For example, overlay marks are formed in three layers: the OD, POLY, and CO layers. Referring to FIGS. 6A and 6B, overlay marks 500 are formed in an OD layer, overlay marks 502 are formed in a POLY layer, and overlay marks 504A, 504B are formed in a CO layer. Overlay marks 504A are formed in an outer CO layer, and overlay marks 404B are formed in an inner CO layer. The overlay marks may be formed in other suitable layers. Similarly to alignment marks 302, the overlay marks of alignment marks 306-2 may be designed to include shapes other than boxes, including triangles, rectangles, circles, T-shapes, L-shapes, pluses, crosses, octagons, other suitable shapes, and/or combinations. Also, the pattern recognition techniques may utilize other overlay target designs, such as frame-in-frame, segmented-frame, advanced imaging metrology (AIM), and short vernier (SVNR).

The overlay marks (outer and inner boxes) are formed by any suitable process, including various photolithography, deposition, and/or etching processes. The overlay marks comprise any suitable material, such as a dielectric material, a conductive material, a photoresist material, and/or other suitable materials. In an example, the outer box may be a via hole, a trench, and/or any other opening. The outer box may be filled with one or more plugs. One or more contrast enhancing materials may be added to the overlay mark materials. The one or more contrast enhancing materials may include a variety of materials, such as one or more dyes, and/or other materials. The dyes may include one or more organic and/or inorganic materials. It is contemplated that the one or more contrast enhancing materials may be absorptive and/or reflective.

In an exemplary pattern recognition method, the outer box is exposed to radiation by a suitable generator known in the art. The radiation includes visible, invisible, fluorescent, and/or polarized (which may include a single mode or multiple mode) radiation. For example, the generator can include an invisible electromagnetic wave generator, which generates a variety of invisible electromagnetic waves, including X-ray, ultraviolet (UV), and/or deep ultraviolet (DUV) waves. It is further contemplated that the radiation may possess a single wavelength or multiple wavelengths. Reflective beams from the outer box are then detected by a detector, which may include a wavelength dispersive spectrometer, an energy dispersive spectrometer, and/or other detectors. When the reflective beams are detected, the location of the outer box may be identified. As a result, the inner box may be properly positioned.

Referring to FIGS. 6A and 6B, each alignment mark 306-2 includes one or more alignment marks in one example. The alignment marks 306-2 include any combination of overlay marks. As shown in FIG. 6A, alignment mark 306-2 includes alignment marks 306A, 306B. Alignment mark 306A includes an outer box (overlay mark) 500 formed in a lower OD layer, a first inner box (overlay mark) 504A formed in an upper outer CO layer, and a second inner box (overlay mark) 504B formed in an upper inner CO layer. The BIB pattern recognition technique aligns the second inner box 504B with the first inner box 504A, outer box 500, and the first inner box 504A with the outer box 500. The OD layer is thus aligned properly with the outer and inner CO layers. Alignment mark 306B includes an outer box (overlay mark) 502 formed in a lower POLY layer, a first inner box (overlay mark) 504A formed in an outer CO layer, and a second inner box (overlay mark) 504B formed in an inner CO layer. The BIB pattern recognition technique aligns the second inner box 504B with the first inner box 504A, outer box 502, and the first inner box 504A with the outer box 502. The POLY layer is thus aligned properly with the outer and inner CO layers.

As shown in FIG. 6B, alignment mark 306-2 is shown including alignment marks 306A, 306B in a different configuration. Alignment mark 306A includes an outer box (overlay mark) 502 formed in a lower POLY layer, a first inner box (overlay mark) 504A formed in an upper outer CO layer, and a second inner box (overlay mark) 504B formed in an upper inner CO layer. The BIB pattern recognition technique aligns the second inner box 504B with the first inner box 504A, outer box 502, and the first inner box 504A with the outer box 502. The POLY layer is thus aligned properly with the outer and inner CO layers. Alignment mark 306B includes an outer box (overlay mark) 500 formed in a lower OD layer and an inner box (overlay mark) 502 formed in the POLY layer. The BIB pattern recognition technique aligns the inner box 502 with the outer box 500. The POLY layer is thus aligned properly with the OD layer.

The alignment marks 306 comprise any suitable dimension, for example, length and width. In the present example, where two alignment marks (e.g., alignment marks 306A, 306B) are formed, the alignment marks 306A, 306B comprise a dimension of about 20 µm×20 µm. These examples should not be interpreted to be limiting. For example, the alignment marks may comprise a length from about 1 µm to about 30 µm and/or a width from about 1 µm to about 30 µm.

Figure 7A:
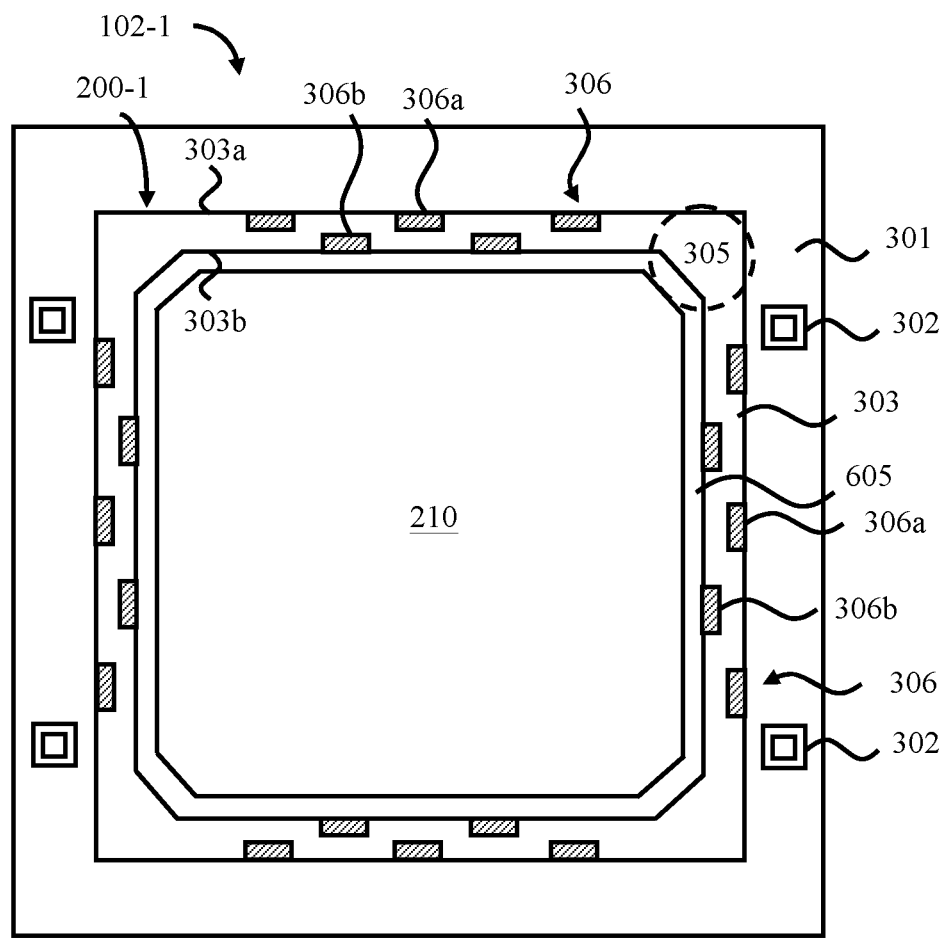
FIG. 7A illustrates a top view of an exposure field according to various embodiments of the present disclosure.
Figure 7B:
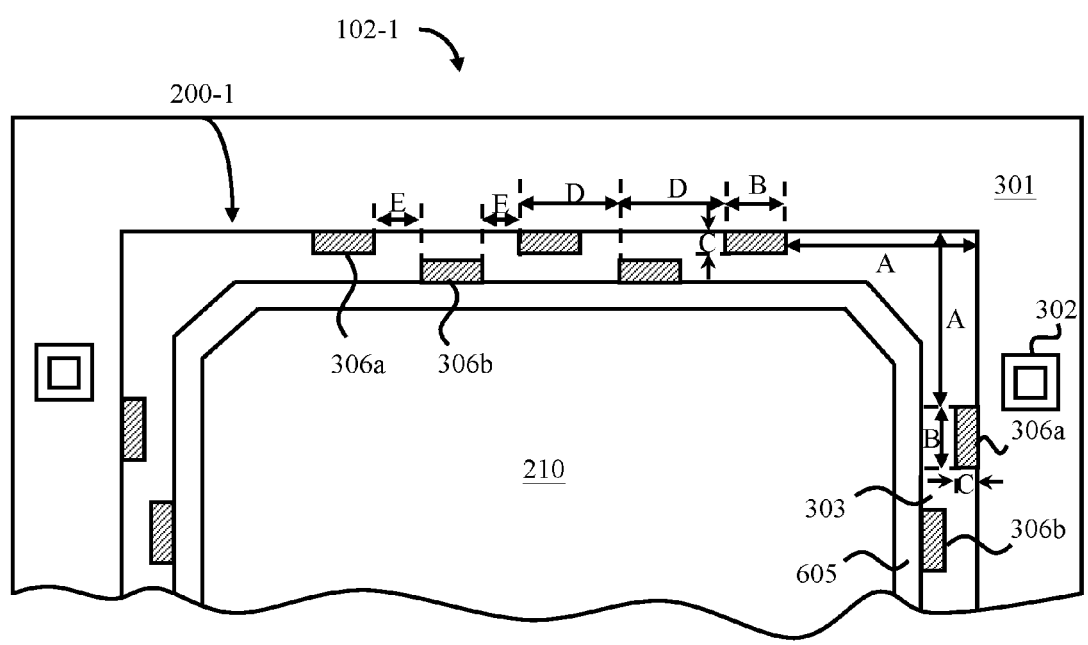
FIG. 7B illustrates an enlarged top view of a portion of the exposure field of FIG. 7A according to various embodiments of the present disclosure.

Referring now to FIGS. 7A and 7B, FIG. 7A illustrates a top view of an exposure field according to various embodiments of the present disclosure, and FIG. 7B illustrates an enlarged top view of a portion of the exposure field of FIG. 7A according to various embodiments of the present disclosure. FIG. 7A provides an embodiment of field 102-1 for patterning a 1×1 chip array, such as FIG. 3A, where a single chip 200-1 is patterned within exposure field 102-1. Chips 200-1, 200-2, . . . and 200-n may be configured similar to chip 200-1. As noted above, the scribe lines 301 define the perimeter of the field 102-1 and the die area 200-1. The scribe lines 301 may comprise any suitable dimensions.

The die 200-1 includes an integrated circuit region 210. The integrated circuit region comprises a plurality of layers, such as active layers (OD layers, defining active areas of the integrated circuit region), poly layers (PO layers, defining gate areas of the integrated circuit region), contact layers (CO layers, defining contacts to the OD and POLY areas), N-well implant layers (NW layers), P-well implant layers (PW layers), P+ implant layers (PP layers), N+ layers (NP layers), metal layers (M1, M2, . . . MN), transistor threshold adjustment implant layers (VT layers), and/or other suitable layers. The plurality of layers in the integrated circuit region 210 form a variety of devices, including passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof.

The die 200-1 further includes a seal ring over a seal ring region 303 surrounding an assembly isolation region 605. The seal ring region 303 and assembly isolation region 605 may include a corner stress relief zone in a corner region 305 at each corner of the seal ring region 303 and assembly isolation region 605 (denoted by dashed circle). Regions outside of the corner regions 305 may be considered non-corner regions or portions of seal ring region 303 and assembly isolation region 605. A portion of the corner of the die 200-1, which includes a portion of the seal ring 303 and corner stress relief zones, may be referred to as a die-corner-circuit-forbidden (DCCF) region. In the present embodiment, the assembly isolation region 605 and the seal ring region 303 surrounds the perimeter of the integrated circuit region 210. The seal ring over the seal ring region 303 creates a barrier to penetration of moisture, corrosive gasses, and chemicals into the interior of the integrated circuit region 210. The seal ring may comprise multiple layers. For example, the seal ring may comprise a plurality of conductive layers, a plurality of insulating layers, a plurality of vias and contacts, a plurality of metal layers, and/or combinations thereof.

The corner stress relief zone may be formed in each corner of the die 200-1. An exemplary shape of the corner stress relief zone may be a trapezoid, but other shapes are contemplated. Each corner stress relief zone can include one or more corner stress relief regions/zones. Examples of corner stress relief zones are illustrated in U.S. Pat. No. 7,202,550 and U.S. Pat. No. 7,378,720, both to Fu et al. and entitled "Integrated Stress Relief Pattern and Registration Structure", both of which are hereby incorporated by reference in their entirety. It is understood that other corner stress relief zones are contemplated, and the Fu et al. references are not intended to be limiting.

The field 102-1 includes exposure field alignment marks 302, and the die 200-1 includes a plurality of die alignment marks 306 (e.g., alignment marks 306a, 306b). The exposure field alignment marks 302 are formed in the four corner regions of the field 102-1 and provide overall field alignment (i.e., exposure field alignment marks). The die alignment marks 306 are formed in non-corner regions of seal ring region 303. In other words, die alignment marks 306 are formed within seal ring region 303 not within a corner region 305 of the seal ring region 303. Five die alignment marks 306 are illustrated in top and bottom sides of the seal ring region 303, and five die alignment marks 306 are illustrated in left and right sides of the seal ring region 303, but other numbers of die alignment marks 306 may be formed. Furthermore, in one example, the plurality of die alignment marks 306a, 306b are disposed within the seal ring region 303 and alternately disposed adjacent an outer edge 303a of the seal ring region and an inner edge 303b of the seal ring region, respectively. In one example, die alignment marks 306a are disposed adjacent outer edge 303a of the seal ring region and die alignment marks 306b are disposed adjacent inner edge 303b of the seal ring region.

Advantageously, the alignment marks 306 do not occupy a large area, and since the alignment marks 306 are formed within the seal ring region, area for the integrated circuit region 210 is saved. Also, the alignment marks 306 are easily integrated into current manufacturing processes, without requiring extraneous expenses or incorporating substantial process alterations. The alignment marks 306 can provide "within field" overlay control, particularly overlay control between layers.

FIG. 7B illustrates an enlarged top view of a top portion of the exemplary field 102-1, with alignment marks 306 (e.g., alignment marks 306a, 306b) positioned in the top side of seal ring region 303 and alignment marks 306 positioned in the left and right sides of seal ring region 303. The positions of alignment marks 306 may be reversed.

The alignment marks 306 are various distances from the seal ring region edges and one another. A side of the alignment marks 306a closest to the corner regions of the seal ring are a first distance A from the outer edge of the seal ring/scribe line. In one example, first distance A may range between about 200 microns and about 2200 microns. Alignment marks 306 (e.g., alignment marks 306a, 306b) may have a length B and a width C. In one example, length B may range between about 5 microns and about 20 microns, and width C may range between about 3 microns and about 10 microns. In yet another example, adjacent alignment marks, such as alignment marks 306a, 306b may be separated from a common end by a distance D and from opposing ends by a distance E. In one example, distance D may range between about 10 microns and about 40 microns, and is about 2000 microns in another example. In one example, distance E may range between about 5 microns and 20 microns, and is about 2000 microns in another example. Although the above ranges and distances have been provided, they are merely examples and not meant to be limiting. A variety of distances are contemplated and symmetrical distances between alignment marks 306 are not required.

Figure 8A:
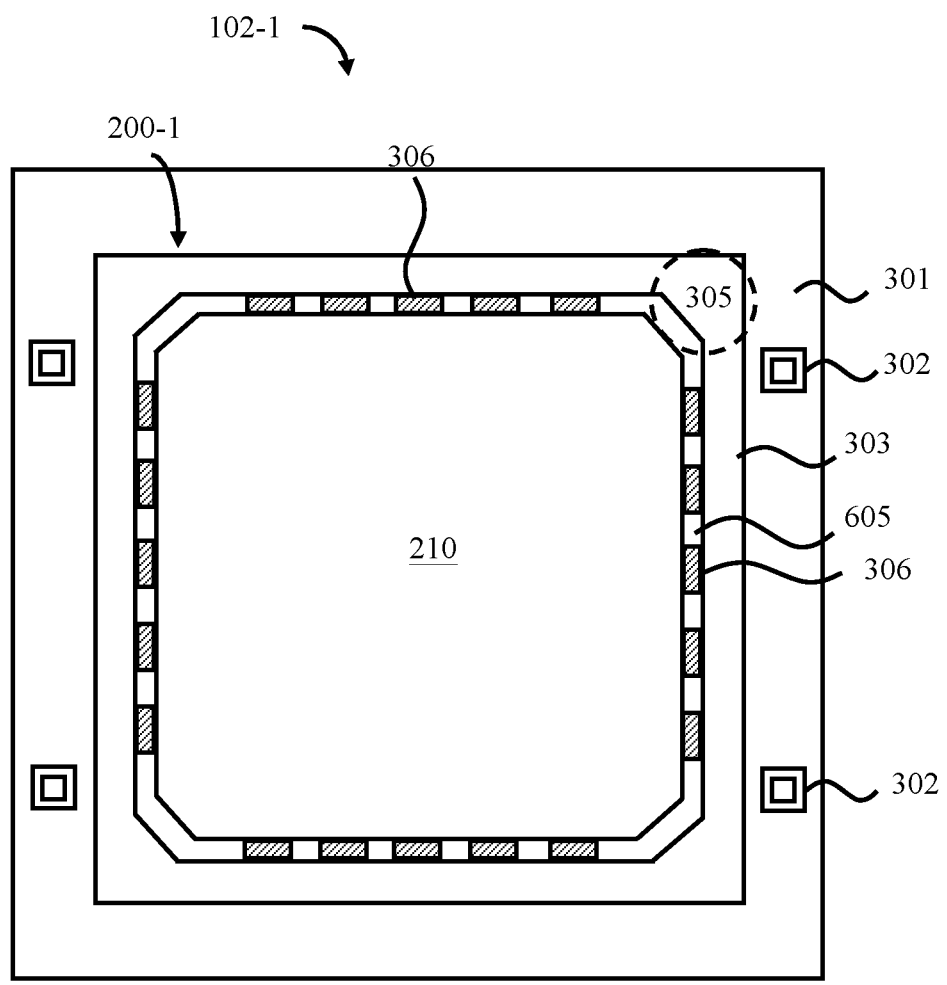
FIG. 8A illustrates a top view of an exposure field according to various embodiments of the present disclosure.
Figure 8B:
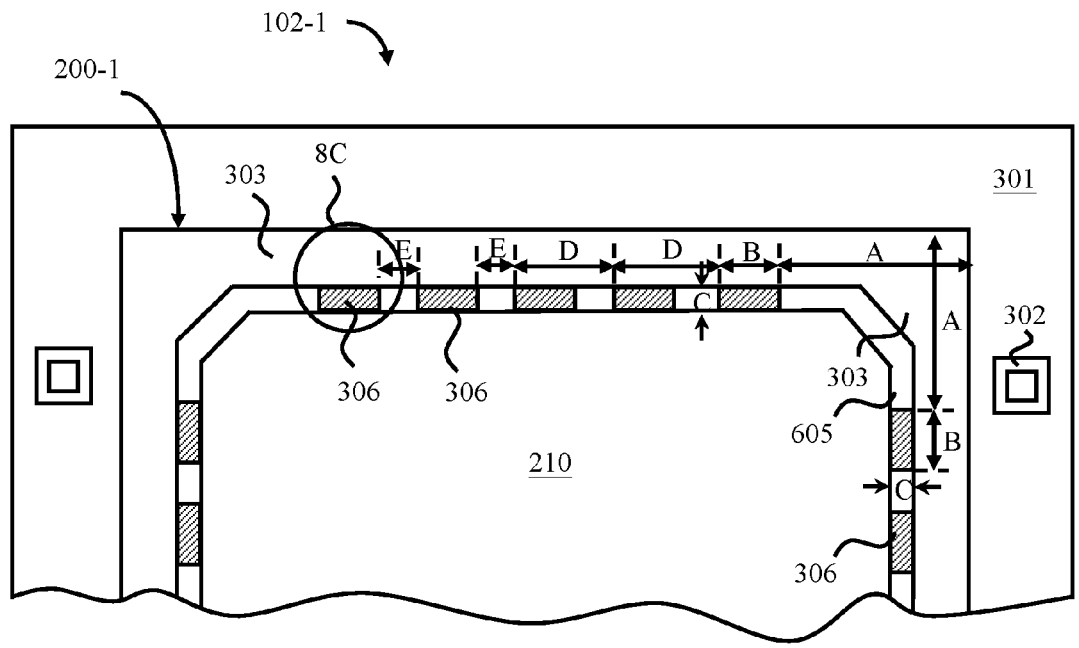
FIGS. 8B and 8C illustrate enlarged top views of portions of the exposure field of FIG. 8A according to various embodiments of the present disclosure.
Figure 8C:
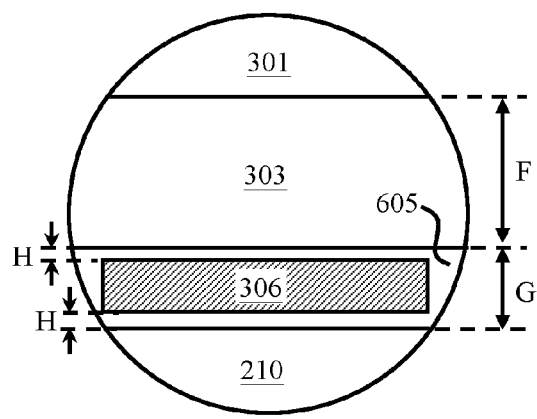

Referring now to FIGS. 8A-8C, FIG. 8A illustrates a top view of an exposure field according to various embodiments of the present disclosure, and FIGS. 8B and 8C illustrate enlarged top views of portions of the exposure field of FIG. 8A according to various embodiments of the present disclosure. FIG. 8A provides an embodiment of field 102-1 for patterning a 1×1 chip array, such as FIG. 3A, where a single chip 200-1 is patterned within exposure field 102-1. Chips 200-1, 200-2, ... and 200-n may be configured similar to chip 200-1. As noted above, the scribe lines 301 define the perimeter of the field 102-1 and the die area 200-1. The scribe lines 301 may comprise any suitable dimensions. This embodiment includes similar features as described above with respect to FIGS. 7A-7B, such as scribe lines 301, exposure field alignment marks 302, seal ring region 303, die alignment marks 306, and assembly isolation region 605, and descriptions of those elements, features, and functions may not be included below to avoid repetitive description but are fully applicable. In this embodiment, die alignment marks 306 are disposed within assembly isolation region 605, and in one example are disposed within assembly isolation region 605 in non-corner regions of assembly isolation region 605. In other words, die alignment marks 306 are formed within assembly isolation region 605 but not within corner region 305.

The alignment marks 306 (e.g., alignment marks 306a, 306b) are various distances from the seal ring region edges and one another as described above, in particular with respect to FIG. 7B. A side of the alignment marks 306 closest to the corner regions of the seal ring are a first distance A from the outer edge of the seal ring/scribe line. In one example, first distance A may range between about 200 microns and about 2200 microns. Alignment marks 306 may have a length B and a width C. In one example, length B may range between about 5 microns and about 20 microns, and width C may range between about 3 microns and about 6 microns. In yet another example, adjacent alignment marks, such as alignment marks 306a, 306b may be separated from a common end by a distance D and from opposing ends by a distance E. In one example, distance D may range between about 10 microns and about 40 microns, and is about 2000 microns in another example. In one example, distance E may range between about 5 microns and 20 microns, and is about 2000 microns in another example. Referring also to FIG. 8C, seal ring region 303 may have a width F and assembly isolation region 605 may have a width G. In one example, width F may range between about 2 microns and about 20 microns, and is about 10 microns in one example. In one example, width G may range between about 4 microns and about 12 microns, and is about 6 microns in one example. Die alignment mark 306 may be centered within assembly isolation region 605 and leave a space H between seal ring region 303 and an adjacent surface of the die alignment mark 306. In one example, space H may range between about 0.5 micron and about 4.5 microns, and is about 2 microns in one example. Although the above ranges and distances have been provided, they are merely examples and not meant to be limiting. A variety of distances are contemplated and symmetrical distances between alignment marks 306 are not required.

Figure 9:
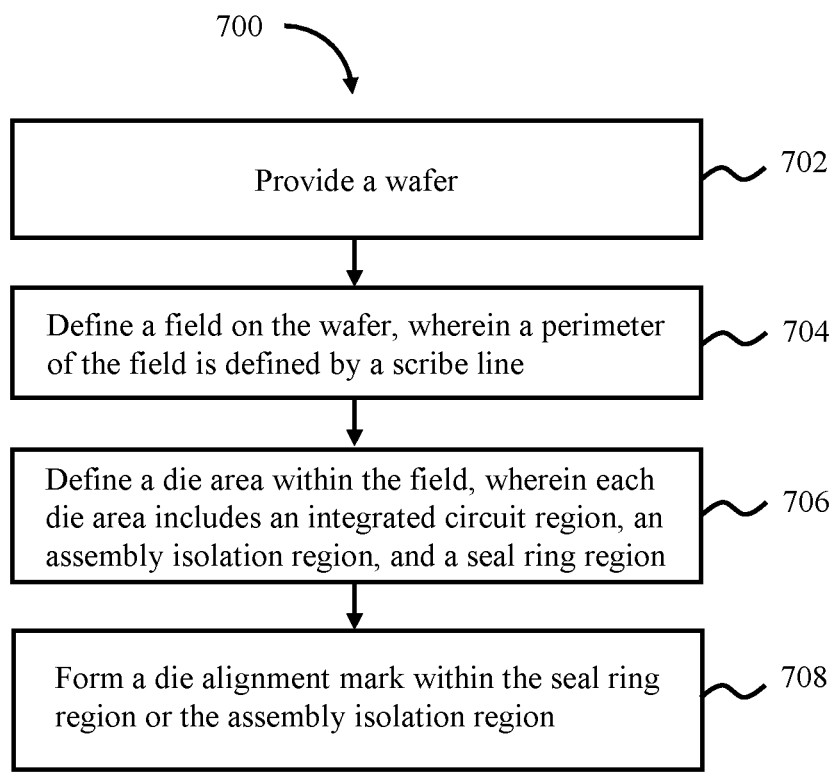
FIG. 9 illustrates a flowchart of a method for enhanced IC alignment according to various embodiments of the present disclosure.

Referring now to FIG. 9, a flowchart illustrates a method 700 for enhanced IC alignment according to various embodiments of the present disclosure. Method 700 includes providing a semiconductor wafer at block 702, and defining a field on the semiconductor wafer, wherein a perimeter of the field is defined by a scribe line, at block 704. Method 700 further includes defining a die area within the field at block 706, wherein each die area includes an integrated circuit region, an assembly isolation region around the integrated circuit region, and a seal ring region around the assembly isolation region, an forming a die alignment mark within the seal ring region or the assembly isolation region at block 708.

It is noted that additional processes may be provided before, during, and after the method 700 of FIG. 9, and that some other processes may only be briefly described herein. In one example, the die alignment mark is not formed in a corner portion of the seal ring region or the assembly isolation region. In yet another example, forming the die alignment mark includes forming one of a critical dimension uniformity pattern including an active (OD) layer, a polysilicon (POLY) layer, a contact (CO) layer, a metal (Mx) layer, and a via (Vx) layer, or a box-in-box alignment pattern. In yet another example, the method may further include forming a scribe line defining the perimeter of an exposure field, and forming an exposure field alignment mark disposed within the scribe line defining the perimeter of the exposure field. In yet another example, the method may further include forming a plurality of die alignment marks within the seal ring region or the assembly isolation region, wherein the plurality of die alignment marks are not formed in a corner portion of the seal ring region or the assembly isolation region. In yet another example, the method may further include performing a pattern recognition technique to align a mask with the die alignment mark, and exposing the semiconductor wafer to form the integrated circuit region.

Advantageously, an improved pattern recognition technique as herein provided takes advantage of forming alignment marks within an exposure field. By providing alignment marks within an exposure field, alignment of in-chip features may be improved. Many variations of the above example are contemplated by the present disclosure. It is understood that different embodiments may have different advantages, and that no particular advantage is necessarily required of all embodiments.

Thus, the present disclosure provides for many different embodiments. According to one embodiment, a semiconductor wafer is provided. The semiconductor wafer comprises a die including an integrated circuit region, an assembly isolation region around the integrated circuit region, and a seal ring region around the assembly isolation region. The wafer further includes a die alignment mark disposed within the seal ring region or the assembly isolation region.

Another broad embodiment provides for a semiconductor wafer including a plurality of exposure fields, and a plurality of dies within each exposure field, wherein each die comprises an integrated circuit region, an assembly isolation region around the integrated circuit region, and a seal ring region around the assembly isolation region. The wafer further includes scribe lines defining each exposure field and each die, an exposure field alignment mark for each exposure field, and a die alignment mark for each die, the die alignment mark disposed within the seal ring region or the assembly isolation region of each die.

Yet another broad embodiment provides for a method comprising providing a semiconductor wafer, defining a field on the semiconductor wafer, wherein a perimeter of the field is defined by a scribe line, and defining a die area within the field, wherein each die area includes an integrated circuit region, an assembly isolation region around the integrated circuit region, and a seal ring region around the assembly isolation region. The method further includes forming a die alignment mark within the seal ring region or the assembly isolation region.

The foregoing outlines features of several embodiments so that those skilled in the art may better understand the aspects of the present disclosure. Features illustrated and discussed above with respect to some embodiments can be combined with features illustrated and discussed above with respect to other embodiments. Those skilled in the art should appreciate that they may readily use the present disclosure as a basis for designing or modifying other processes and structures for carrying out the same purposes and/or achieving the same advantages of the embodiments introduced herein. Accordingly, all such modifications are intended to be included within the scope of this disclosure. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a die including an assembly isolation region, a seal ring region around the assembly isolation region, and a scribe line region around the seal ring region; and
a plurality of die alignment marks disposed within the seal ring region that are alternately disposed adjacent the scribe line region and the assembly isolation region.

2. The device of claim 1, wherein the plurality of die alignment marks are not disposed in a corner portion of the seal ring region.

3. The device of claim 1, wherein the plurality of die alignment marks comprise a critical dimension uniformity pattern including an active (OD) layer, a polysilicon (POLY) layer, a contact (CO) layer, a metal (Mx) layer, and a via (Vx) layer.

4. The device of claim 1, wherein the plurality of die alignment marks comprise a box-in-box alignment pattern.

5. The device of claim 1, wherein the plurality of die alignment marks comprise at least one overlay mark formed in an active (OD) layer, a poly (POLY) layer, and/or a contact (CO) layer.

6. The device of claim 5, wherein the at least one overlay mark comprises an overlay mark formed in a lower OD layer, an overlay mark formed in an upper outer CO layer, and an overlay mark formed in an upper inner CO layer.

7. The device of claim 5, wherein the at least one overlay mark comprises an overlay mark formed in a lower POLY layer, an overlay mark formed in an outer CO layer, and an overlay mark formed in an inner CO layer.

8. The device of claim 1, further comprising:
a scribe line defining the perimeter of an exposure field; and
an exposure field alignment mark disposed within the scribe line defining the perimeter of the exposure field.

9. The device of claim 8, wherein the exposure field alignment mark comprises a box-in-box alignment pattern.

10. A semiconductor device, comprising:
a die comprising an integrated circuit region, an assembly isolation region around the integrated circuit region, and a seal ring region around the assembly isolation region; and
a die alignment mark within the seal ring region or the assembly isolation region of the die, wherein the die alignment mark includes overlay marks formed in an active (OD) layer, a polysilicon (POLY) layer, and a contact (CO) layer.

11. The device of claim 10, wherein the die alignment mark is disposed in a non-corner portion of the seal ring region or the assembly isolation region.

12. The device of claim 10, wherein the die alignment mark comprises one of a critical dimension uniformity pattern including an active (OD) layer, a polysilicon (POLY) layer, a contact (CO) layer, a metal (Mx) layer, and a via (Vx) layer, or a box-in-box alignment pattern.

13. The device of claim 10, further comprising a plurality of die alignment marks disposed within the seal ring region or the assembly isolation region of each die, wherein the plurality of die alignment marks are disposed in a non-corner portion of the seal ring region or the assembly isolation region.

14. The device of claim 13, wherein the plurality of die alignment marks disposed within the seal ring region are alternately disposed adjacent an outer edge of the seal ring region and an inner edge of the seal ring region.

15. A method, comprising:
providing a semiconductor device;
defining a die area on the semiconductor device, wherein the die area includes a seal ring region; and
forming a plurality of die alignment marks within the seal ring region, wherein the plurality of die alignment marks are alternately disposed adjacent an outer edge of the seal ring region and an inner edge of the seal ring region.

16. The method of claim 15, wherein the plurality of die alignment marks are not formed in a corner portion of the seal ring region.

17. The method of claim 15, wherein forming the plurality of die alignment marks includes forming one of a critical dimension uniformity pattern including an active (OD) layer, a polysilicon (POLY) layer, a contact (CO) layer, a metal (Mx) layer, and a via (Vx) layer, or a box-in-box alignment pattern.

18. The method of claim 15, further comprising:
forming a scribe line defining the perimeter of an exposure field; and
forming an exposure field alignment mark disposed within the scribe line defining the perimeter of the exposure field.

19. The method of claim 18, wherein the exposure field alignment mark comprise a box-in-box alignment pattern.

20. The method of claim 15, further comprising:
performing a pattern recognition technique to align a mask with at least one die alignment mark; and
exposing the semiconductor device to form the integrated circuit region.

* * * * *